(12) United States Patent
Yoo et al.

(10) Patent No.: US 7,313,715 B2
(45) Date of Patent: Dec. 25, 2007

(54) MEMORY SYSTEM HAVING STUB BUS CONFIGURATION

(75) Inventors: Chang-sik Yoo, Suwon (KR); Byung-se So, Sungnam (KR); Kye-hyun Kyung, Suwon (KR)

(73) Assignee: Samsung Electronics Co., Ltd. (KR)

( * ) Notice: Subject to any disclaimer, the term of this patent is extended or adjusted under 35 U.S.C. 154(b) by 393 days.

(21) Appl. No.: 10/043,047

(22) Filed: Jan. 9, 2002

(65) Prior Publication Data

US 2002/0161968 A1 Oct. 31, 2002

Related U.S. Application Data

(60) Provisional application No. 60/267,908, filed on Feb. 9, 2001.

(51) Int. Cl.
*G06F 1/04* (2006.01)

(52) U.S. Cl. ...................................... 713/500; 713/600

(58) Field of Classification Search ................ 713/500, 713/600
See application file for complete search history.

(56) References Cited

U.S. PATENT DOCUMENTS

| | | | |
|---|---|---|---|
| 5,357,621 A | 10/1994 | Cox | 395/400 |
| 5,379,248 A * | 1/1995 | Wada et al. | 365/63 |
| 5,390,356 A * | 2/1995 | Houlberg | 703/23 |
| 5,432,823 A * | 7/1995 | Gasbarro et al. | 375/356 |
| 5,650,757 A | 7/1997 | Barber | 333/128 |
| 5,987,576 A | 11/1999 | Johnson et al. | |
| 5,991,850 A | 11/1999 | Ryan | 711/105 |
| 5,998,860 A * | 12/1999 | Chan et al. | 257/679 |
| 6,016,282 A | 1/2000 | Keeth | 365/233 |
| 6,029,250 A * | 2/2000 | Keeth | 713/400 |
| 6,034,878 A | 3/2000 | Osaka et al. | 365/52 |
| 6,043,704 A * | 3/2000 | Yoshitake | 327/565 |
| 6,075,393 A | 6/2000 | Tomita et al. | |
| 6,078,514 A | 6/2000 | Takemae et al. | |
| 6,088,774 A | 7/2000 | Gillingham | 711/167 |
| 6,109,929 A | 8/2000 | Jasper | 439/74 |
| 6,115,318 A | 9/2000 | Keeth | 365/233 |

(Continued)

FOREIGN PATENT DOCUMENTS

EP 0 862 119 A2 9/1998

(Continued)

OTHER PUBLICATIONS

Newton's Telecom Dictionary, 2005, CMP Books, 21st Edition, p. 135, term "buffer".*

(Continued)

*Primary Examiner*—Rehana Perveen
*Assistant Examiner*—Tse Chen
(74) *Attorney, Agent, or Firm*—Mills & Onello LLP

(57) ABSTRACT

A memory system having a stub-bus configuration transmits a free-running clock through the same path as data signals. A single clock domain is employed for both read and write operations. For both operations, the read or write clock signal is routed through the same transmission path as the data, thereby increasing system transfer rates by maximizing the window of data validity. In this manner, data bus utilization is increased due to the elimination of a need for a preamble interval for the strobe signal, and pin count on the memory module connectors is therefore reduced.

53 Claims, 10 Drawing Sheets

U.S. PATENT DOCUMENTS

| | | | |
|---|---|---|---|
| 6,128,748 A | 10/2000 | MacWilliams et al. | 713/401 |
| 6,131,149 A | 10/2000 | Lu et al. | 711/167 |
| 6,326,853 B1 * | 12/2001 | Moyal et al. | 331/34 |
| 6,393,541 B1 | 5/2002 | Fujii | |
| 6,397,312 B1 * | 5/2002 | Nakano et al. | 711/167 |
| 6,510,503 B2 * | 1/2003 | Gillingham et al. | 711/167 |

FOREIGN PATENT DOCUMENTS

| | | |
|---|---|---|
| JP | 9-179819 | 7/1997 |
| JP | 10-254579 | 9/1998 |
| JP | 11-39869 | 2/1999 |
| JP | 11-86546 | 3/1999 |
| JP | 11-149437 | 6/1999 |
| JP | 11-161601 | 6/1999 |
| JP | 2000-132975 | 5/2000 |

OTHER PUBLICATIONS

Crisp, Richard, "Direct Rambus Technology: The New Main Memory Standard," IEEE Micro, Nov./Dec. 1997, pp. 18-28.

* cited by examiner

MEMORY SYSTEM HAVING STUB BUS CONFIGURATION

RELATED APPLICATIONS

This application claims the benefit of United States Provisional Application Ser. No. 60/267,908, filed Feb. 9, 2001, the contents of which are incorporated herein by reference, in their entirety.

BACKGROUND OF THE INVENTION

Since the introduction of synchronous dynamic random access memories (SDRAMs) wherein the data transfer rate of the memory system is directly dependent on system clock rate, a number of advances have been made to further increase the data rate. For example, double data rate (DDR) SDRAMs further increase data transfer rates by causing the data transmission/reception to occur at both rising and falling edges of the system clock. In order to assign a sufficient timing budget in receiving data from a memory controller and a DRAM module with increased data transfer rate, the concept of source synchronous clocking, which allows routing of a synchronous clock through the same path as that of the data, has been introduced. This concept is illustrated in FIGS. 1 and 2.

FIG. 1 illustrates source synchronous clocking using a bidirectional strobe signal DQS as well as the system clock signal CK in a DDR SDRAM. The DQS signals are generated by either a memory controller 20 or DRAM devices 22 and are used as timing reference signals for writing data to the DRAM modules 22 and for reading data from the DRAM modules 22. The data are transferred via the data bus DQ using the DQS strobe signals as a timing reference. The DQS strobe signals are routed through the same path as the DQ signals. The memory controller 20, or DRAM modules 22, sample the data respectively using the strobe signals DQS transmitted through the same path as the data bus, instead of using the system clock CK as a reference. The system clock (CK) is used for sampling the command/address signals (Com/Add) at the DRAM 22, and DQ signals sampled by the DQS signal are translated to the system clock domain internally both at the DRAM 22 and at the controller 20.

FIG. 2 illustrates a typical rambus DRAM configuration. In this configuration, a DRAM module 26 and a memory controller 24 receive two clocks, namely a Clk-From-Master (CFM) signal a Clk-To-Master (CTM) signal. The CFM signal is used as a reference clock for write data, and the CTM signal is used as a reference clock for read data. In each case, the data and clock signals are routed and transferred through the same data path.

For the DDR SDRAM approach illustrated in FIG. 1, a preamble timing interval is required following a read or write command. The preamble interval includes information regarding entry of a valid data strobe signal, and is necessary because the DQS signal can be generated by either the memory controller 20 or the DRAM 22. If the source of the DQS signal changes, then the preamble period must be initiated to pass the token from one to the other. Typically, this preamble interval consumes an entire clock cycle before valid data can be transmitted. Since transmission of data is not permitted during the preamble interval, overall efficiency of the system bus is adversely affected. In the rambus DRAM approach illustrated in FIG. 2, the use of the forward clock CFM and the return clock CTM again results in the crossing of two clock domains within a DRAM module 26. The resulting configuration is therefore complicated since sophisticated compensation circuitry is required to manage the phase difference between the CFM and CTM clock signals, and since an initialization procedure is needed for the phase compensation circuitry. In both DDR SDRAM and rambus DRAM architectures, the pin count for the memory module connector is increased due to the increased number of clock pins, and in the case of rambus, the data pin count is doubled.

SUMMARY OF THE INVENTION

The present invention is directed to a memory system having a stub bus configuration that transmits a free-running clock through the same path as data signals and a method for transferring data in such a system. A single clock domain is employed for both read and write operations. For both operations, the read or write clock signal is routed through the same transmission path as the data, thereby increasing system transfer rates by maximizing the window of data validity. In this manner, data bus utilization is increased due to the elimination of a need for a preamble interval for the strobe signal, and pin count on the memory module connectors is therefore reduced.

In one embodiment, the present invention is directed to a memory system having a stub configuration and a method for transferring data in such a system. The system includes a controller for generating a first clock signal, a control signal, an address signal, and data signals on a data bus, the data bus, first clock signal, control signal, and address signal being arranged in a stub configuration. A memory module includes a memory device coupled to the controller, the memory module receiving the first clock signal and the control signal that includes a read or write command. The memory module, in response to the write command, initiates a write operation for writing the data signals from the data bus to the memory in synchronization with the first clock signal. The memory module, in response to the read command, initiates a read operation for reading data from the memory to the data bus in synchronization with the first clock signal, and generates a second clock signal in response to the first clock signal, the second clock signal being provided to the controller, the controller receiving the data signals on the data bus in response to the second clock signal during the read operation.

In a preferred embodiment, the first clock signal comprises a write clock and the second clock signal comprises a read clock. The system preferably comprises multiple memory modules wherein the multiple memory modules each generate independent second clock signals, the second clock signals each being different in phase. The phases of the multiple second clock signals are different in phase due to the difference in propagation delay between each of the memory modules and the controller. The propagation delay of the second clock signal from the memory module to the controller is substantially equal to that of the data bus.

The memory module may further include a control buffer that receives the first clock signal and the control signal and generates the second clock signal in response to the first clock signal. A phase locked loop or delay locked loop may be provided for generating the second clock signal in response to the first clock signal, within the control buffer, or independent of the control buffer. Alternatively, a return path may be coupled directly to a first clock signal line that receives the first clock signal for generating the second clock signal in response to the first clock signal.

A capacitor may be included having a capacitance that is selected to compensate for capacitive loading on the data bus by the memory device of the memory module; the capacitor being coupled to a junction of the first clock signal line and the second clock signal line.

The memory system may include first and second memory modules, the memory module generating respective first and second independent return clock signals as the second clock signal, and further comprising a motherboard coupling the first and second memory modules and the controller, the motherboard including the data bus, a control bus for transfer of the control signals, an address bus for transfer of the address signals, a first clock signal line for transfer of the first clock signal and first and second independent return clock signal lines for transfer of the first and second return clock signals. The first and second return clock signal lines are crossed on the motherboard between the first and second modules so as to ensure similar pin-out configurations at the connectors of the memory modules. The first return clock signal line is preferably coupled to a dummy load on the second memory module and the second return clock signal line is coupled to a dummy load on the first memory module. The dummy load preferably comprises a load capacitor or a dummy pin and is selected to match the capacitance loading of the data bus.

A first flag signal may be generated by the memory controller, the memory module, in response to the first flag signal, controlling timing of initiation of the write operation or read operation. If a read operation is commanded, the memory module generates a second flag signal in response to the first flag signal, the second flag signal being provided to the controller, the controller receiving the data signals on the data bus in response to the second clock signal and the second flag signal during a read operation.

The memory system preferably includes first and second memory modules, the memory module generating respective first and second independent second flag signals, and further comprising a motherboard coupling the first and second memory modules and the controller, the motherboard including the data bus, a control bus for transfer of the control signals, an address bus for transfer of the address signals, a first flag signal line for transfer of the first flag signal, and first and second independent return flag signal lines for transfer of the first and second return flag signals, the first flag signal line and the first and second return flag signal lines being routed with the control bus and the address bus. The first and second return flag signal lines may be crossed on the motherboard between the first and second modules. The first return flag signal line may be coupled to a dummy load on the second memory module and the second return flag signal line may be coupled to a dummy load on the first memory module. The dummy load preferably comprises a load capacitor or a dummy pin that is selected to match the capacitance loading of the data bus.

The control buffer may be mounted to a first side of the memory module, and a dummy load couples to a first signal line of the control buffer to provide load matching with a load experienced by a second signal line of the memory devices mounted to both first and second sides of the memory module. The dummy load may comprise, for example, a load capacitor or a dummy pin. The first signal line may comprise the first clock signal or the second clock signal, and the second signal line may comprise the data bus or the first clock signal.

In another embodiment, the present invention is directed to a memory system having a stub configuration and a method for transferring data in such a system. The system includes a controller for generating a first clock signal, a control/address signal, and data signals on a data bus, the data bus, first clock signal, and control/address signal being arranged in a stub configuration. A second clock signal generator generates a second clock signal. A memory module includes memory coupled to the controller, the memory module receiving the first clock signal, the second clock signal and the control/address signal that includes a read or write command. The first clock signal propagates from the controller to the memory module in a first direction of propagation, and the second clock signal propagates from the memory module to the controller in a second direction of propagation. The memory module, in response to the write command, initiates a write operation for writing the data signals from the data bus to the memory based on the first clock signal. The memory module, in response to the read command, initiates a read operation for reading data from the memory to the data bus in response to the second clock signal, the controller receiving the data signals on the data bus in response to the second clock signal during the read operation. The memory controller preferably compensates for phase difference between the received second clock signal and the data signals on the data bus.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS

Figure 1:
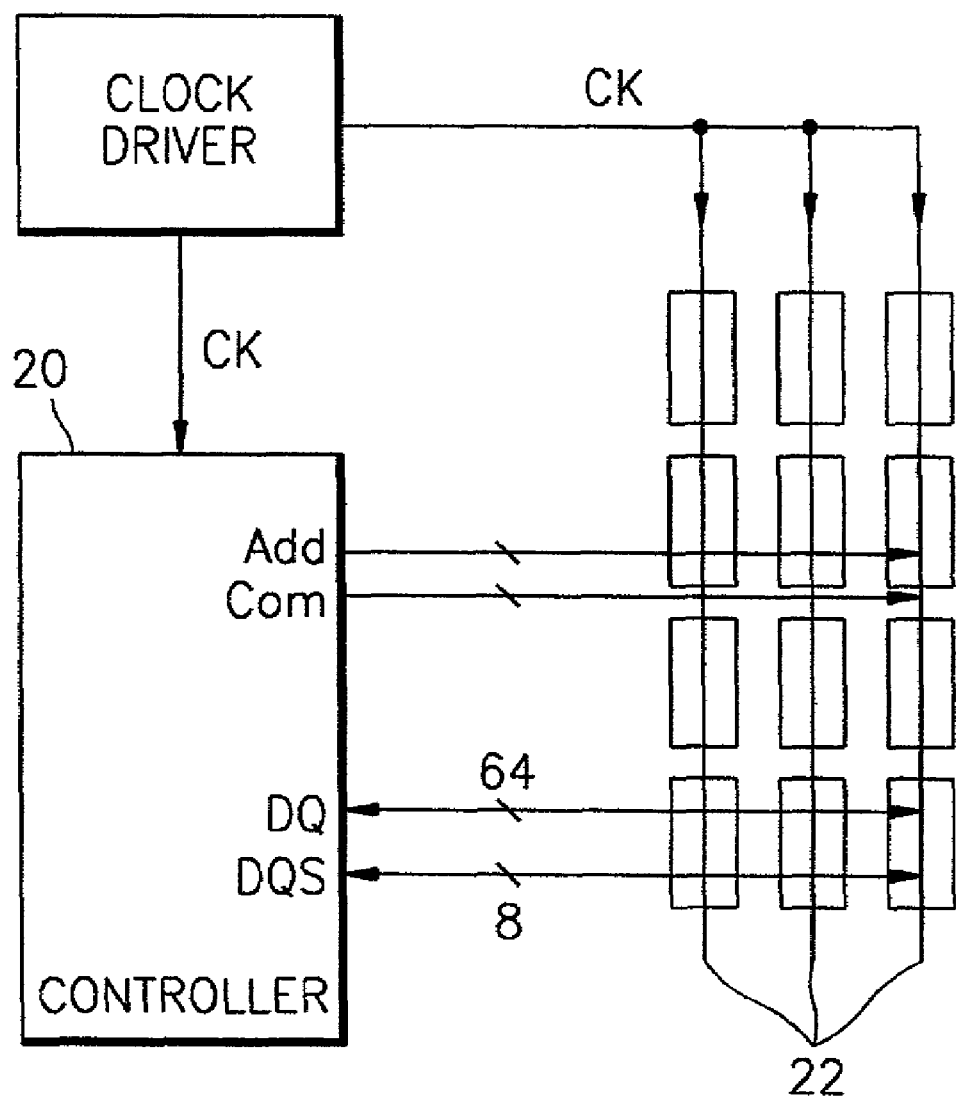
FIG. 1 is a schematic block diagram of a conventional double data rate (DDR) synchronous dynamic random access memory (SDRAM) employing a bidirectional strobe signal DQS and a system clock signal CK.
Figure 2:
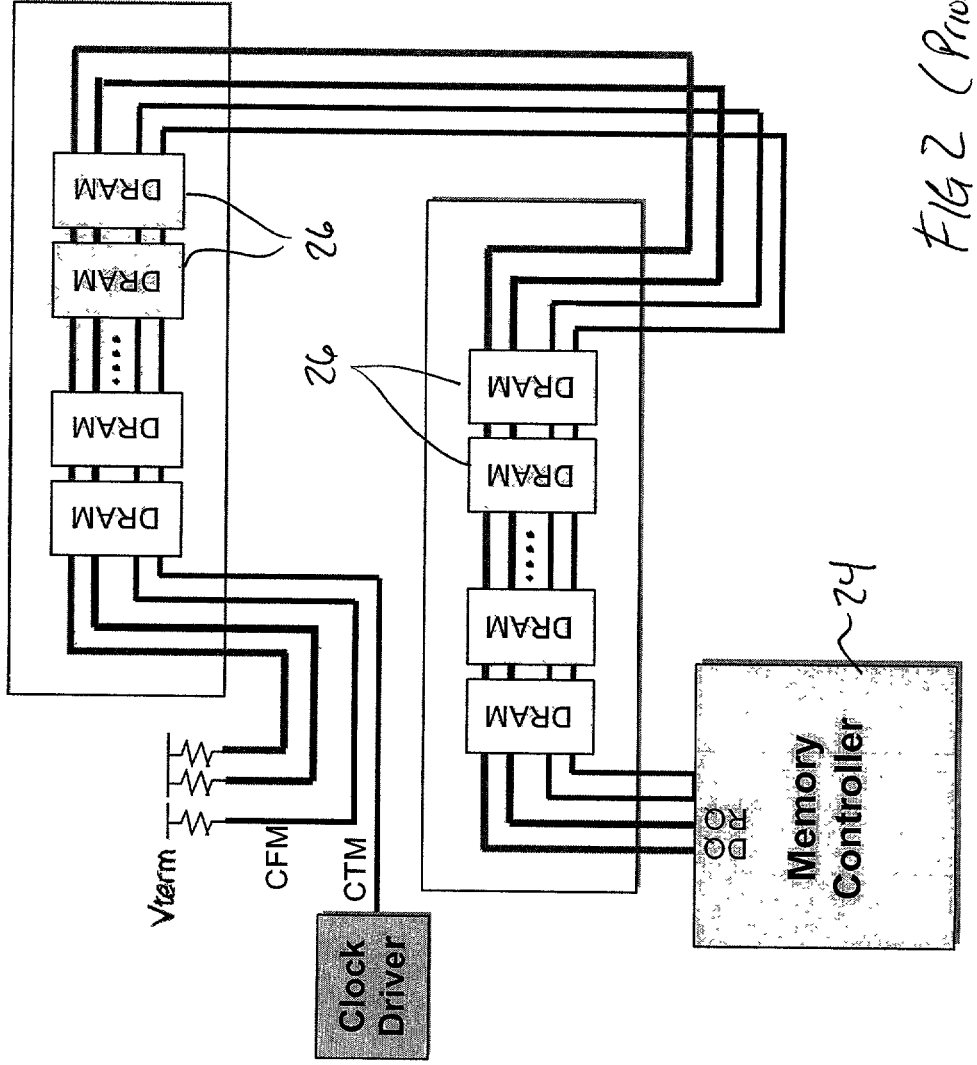
FIG. 2 is a block diagram of a conventional rambus DRAM configuration employing a forward clock CLK_FROM_MASTER and a return clock CLK_TO_MASTER.
Figure 3:
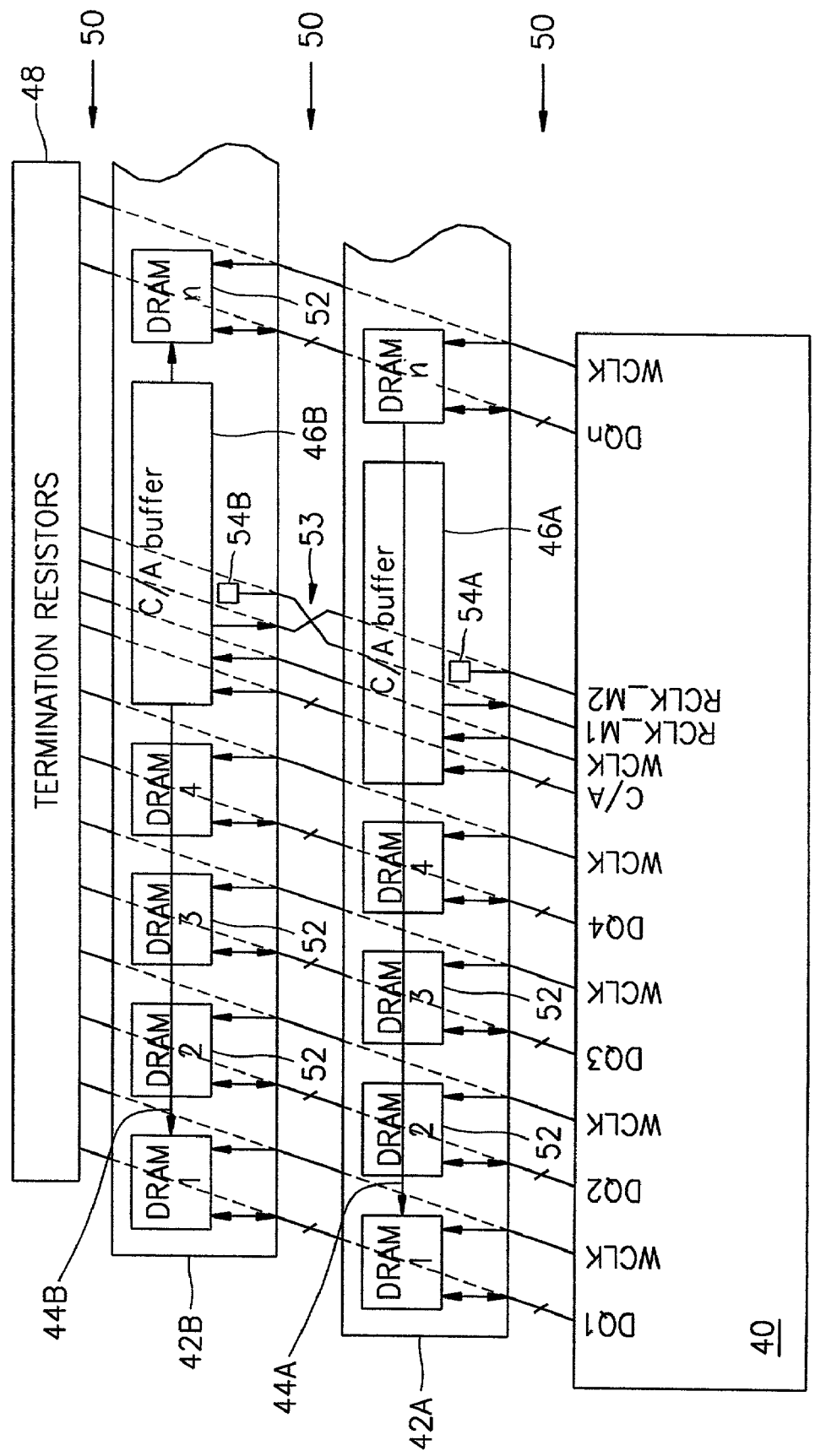
FIG. 3 is a schematic block diagram of a memory system according to the present invention, wherein the C/A buffer generates a read clock signal RCLK based on the write clock signal WCLK.

FIG. 3 is a schematic block diagram of a memory system having two memory modules configured in accordance with the present invention. The system includes a controller 40, first and second memory modules 42A, 42B respectively, a system bus 50 interconnecting the memory modules 42A, 42B and the controller 40, and termination resistors 48 for terminating the system bus 50. The memory modules 42A, 42B are configured in a stub arrangement, meaning that the signals pass to and from the memory modules 42 from the system bus 50 as a stub, or branch extension, of the system bus 50, as opposed to a point-to-point or serial configuration. In this configuration, all clock, data, and command/address signal lines reaching the memory modules are stubs of the system bus. Each memory module 42A, 42B includes a plurality of memory devices 52, for example DRAM units DRAM1-DRAMn and a command/address buffer 46A, 46B. The memory devices 52 may extend along the module body to the left and right of the C/A buffer 46A, 46B as shown, however, for the purpose of illustrating the present invention, only the left half of the module is illustrated in FIG. 3. The C/A buffers 46A, 46B receive command and/or address (C/A) signals in synchronization with the write clock signal WCLK. The received C/A signals are in turn provided to the DRAMs 52 via C/A signal line 44A, 44B, again in synchronization with the WCLK signal. The use of a C/A buffer 46A, 46B on each memory module 42A, 42B alleviates loading of the command/address bus C/A on the system motherboard.

The system bus 50 further includes a number of data bus signals DQ1-DQn that correspond to memory devices 52 DRAM1-DRAMn on the memory modules 42A, 42B. Each of data bus signals DQ1-DQn is in turn comprised of multiple data signal lines, for example, 4, 8, or 16 lines. The write clock signal WCLK is buffered and distributed at the memory controller 40 and routed along with corresponding data bus signals DQ1-DQn, as well as the command/address C/A signal, so as to ensure that the data bus DQ signals and the C/A signals arrive at the memory modules 42A, 42B at the same time as the corresponding WCLK signal.

In this manner, in the case of a write operation where it is intended to write data from the memory controller 40 to a memory device 52, the memory controller 40 outputs the write data DQ in synchronization with the write clock signal WCLK, and thus transmits the write data DQ to the memory devices 52 on the appropriate memory module 42A, 42B. Since the data bus DQ and the write clock line WCLK have the same stub configuration, the write data on the DQ bus and the write clock signal on the write clock line WCLK are input at the memory devices 52 subject to an equal propagation delay time. In this manner, assuming a given memory device 52 samples the write data DQ using the write clock signal WCLK, a maximum valid data window is achieved.

On the other hand, in the read operation, that is the case of the transfer of data from the memory modules 42A, 42B to the memory controller 40, a read clock (RCLK) signal is output from the C/A buffer 46A, 46B, and is transferred to the memory controller 40 along with the data read from the memory device 52. When the memory device 52 in a memory module 42A outputs the read data DQ in synchronization with the WCLK signal, the C/A buffer 46 also outputs the read clock signal RCLK at the same time. By synchronizing the read clock RCLK signal with the received write clock WCLK signal, the read data DQ and read clock RCLK signals arrive at the memory controller 40 with an equal propagation delay because they have the same stub bus path length along the system bus 50 and along the stub path between the memory module 42 and the system bus 50. The configuration of FIG. 3 thus alleviates a phase differential problem that would otherwise occur in transferring data that is read from the memory devices 52 to the memory controller 40. Assume, for a moment, that the read clock signal RCLK, rather than being synchronized with the received write clock signal WCLK, is instead sourced at the memory controller 40 and distributed to the memory modules 42 in a stub bus configuration. In this case, the direction of the transmission of the read clock RCLK would have an opposite direction to that of the read data DQ and therefore would have an entirely different phase relationship with the read data DQ. Assume also a different case where the read clock RCLK is again distributed in a stub bus configuration to all memory modules 42 and to the memory controller 40, but is sourced at a location that is on the system bus 50 beyond the outermost memory module 42B. In this configuration, discussed with reference to FIGS. 9 and 10 below, the resulting timing relationship would be improved since the read data DQ and the read clock RCLK would be propagating in the same direction. However, the read data DQ and the read clock RCLK as received at the controller 40 would have a timing difference on the order of two times the stub delay, since in order for the data to be activated on the data bus DQ, the read clock signal RCLK is first received by the memory device 52 via one pass of the stub and the read data DQ transmitted through a second pass of the stub to the system bus 50 and to the memory controller 50. Thus, the read data DQ received at the memory controller 40 is delayed, with respect to the RCLK signal, by a time period corresponding to two times the propagation delay of the stub path of the module from which the read data DQ is sourced. Therefore a longer setup time period is necessary before the read data DQ can be sampled by the controller. This is an inherent problem of the stub bus architecture.

The problem identified above is alleviated by the memory system configured in accordance with the present invention. In this configuration, read data DQ is output from a memory device 52 located on any of the memory modules 42A, 42B in synchronization with the received write clock signal WCLK. For example, assuming that data is to be read from a memory device 52 on the first memory module 42A, a first read clock signal RCLK_M1 is output from the C/A buffer 46A in synchronization with the received write clock signal WCLK and transferred to the memory controller 40 via a path having the same path length as that of the read data DQ. Because the read clock signal RCLK_M1 and read data DQ propagate along the same stub bus path, they arrive at the memory controller 40 with an equal delay time and therefore, the read data DQ can be sampled using the read clock signal RCLK_M1 immediately, without the need for phase compensation or a preamble interval as required by the conventional strobe approaches.

The same scenario applies in the case where data is to be read from a memory device 52 on the second memory module 42B. A read clock signal RCLK_M2 is generated in response to the write clock signal WCLK and is synchronized therewith. The read clock signal RCLK_M2 is transmitted via the system bus 50 along with the read data DQ, and is received at the memory controller 40 as a second read clock signal RCLK_M2 that is separate from and independent of the first read clock signal RCLK_M1. Separate read clock signals RCLK_M1, RCLK_M2, are necessary because the phases of the read clock signals RCLK from the plurality of memory modules 42A, 42B are different due to the difference in signal path length between each respective module 42A, 42B and the memory controller 40. In order to permit the memory modules 42A, 42B to have the same pin configurations, an advantageous feature for mass manufacturing of the modules, the read clock signal lines RCLK_M1, RCLK_M2 are crossed on the motherboard hosting the system bus 50, as shown at location 53.

In order to further improve performance, capacitive loading on the DQ bus and RCLK bus should be equal for all memory modules 42A, 42B. To achieve this, the RCLK_M1 signal may be connected to a dummy load capacitor or a dummy pin 54B of the second memory module 42B. Likewise, the RCLK_M2 signal is connected to a dummy load capacitor or a dummy pin 54A of the first memory module 42A. In configuration employing more than two memory modules 42A, 42B, the read clock signals RCLK_Mn of the other modules in the system would be tied to dummy load capacitors or dummy pins of a given module. If a capacitor is used, the capacitance value should be chosen to equal the input capacitance of the RCLK pin. If a dummy pin is used, the design of the C/A buffer would ensure the input capacitance of the dummy pin to be equal to that of the RCLK pin.

In the above example of FIG. 3, the C/A buffer 42A, 42B preferably includes a phase locked loop (PLL) or delay locked loop (DLL) that serves to generate a read clock signal RCLK that is synchronized with the received write clock signal WCLK; namely, the transition edges of the RCLK signal are aligned with those of the WCLK signal. In the phase locked loop (PLL), the phase of the voltage controlled oscillator is controlled until the output clock edge is aligned to that of the WCLK. In the delay locked loop (DLL) the WCLK is applied to a variable delay line the delay of which is controlled until the output clock edge is aligned with that of the WCLK.

Figure 4:
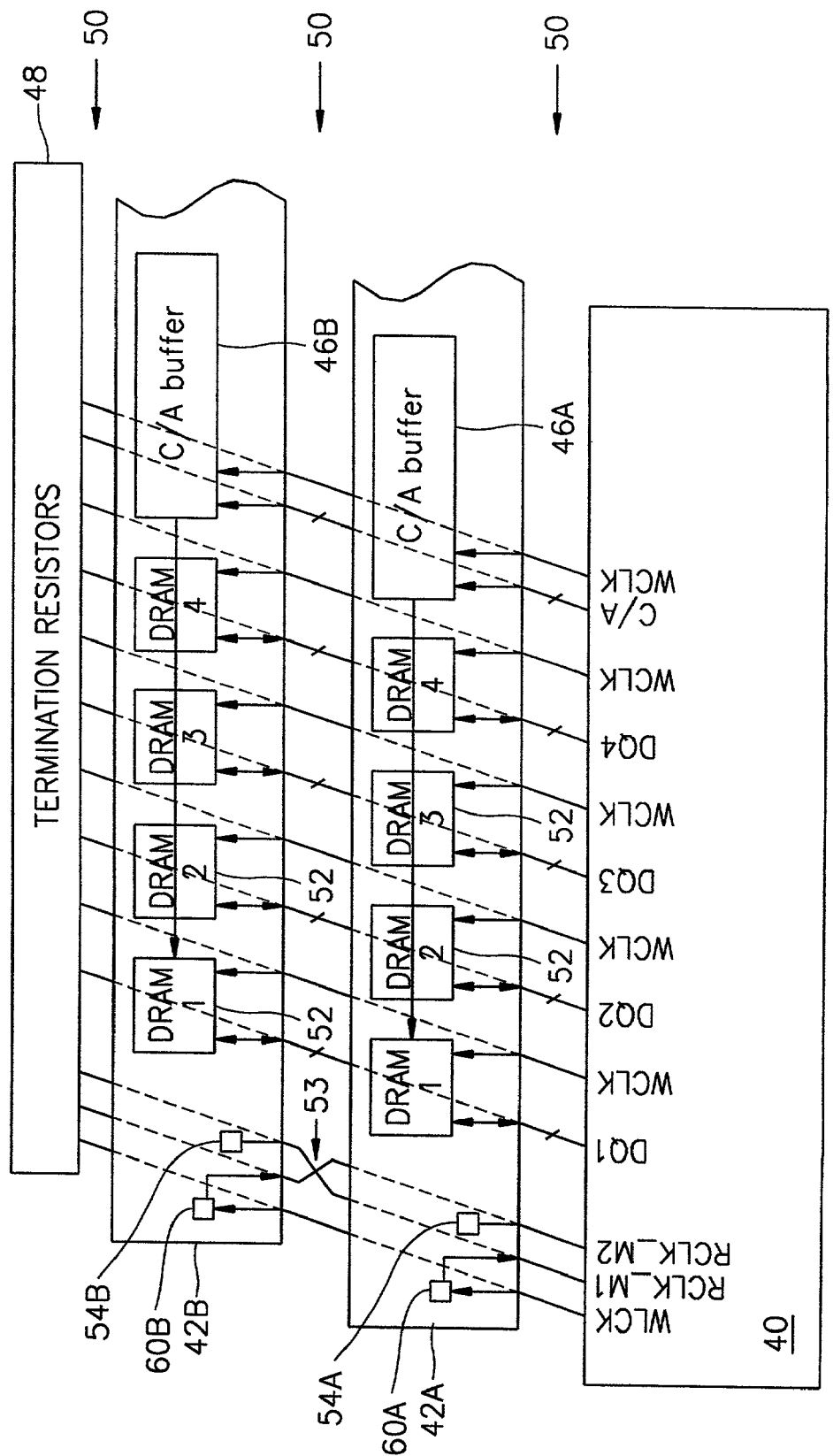
FIG. 4 is a schematic block diagram of an alternative embodiment of the present invention wherein the memory modules include a return path for returning the write clock signal WCLK as the read clock signal RCLK.

FIG. 4 is a schematic block diagram of an alternative embodiment of the present invention for the case where the C/A buffer 46A, 46B on the memory module 42A, 42B is incapable of generating the RCLK signal in synchronization with the WCLK signal, for example in the case where the C/A buffer does not include a PLL or DLL. In this embodiment, the WCLK signal is made to drive a dummy capacitor 60A, 60B on each module 42A, 42B, the dummy capacitor 60A, 60B having a capacitance value that emulates the capacitance of the memory device 52 from which data is being read. The capacitance experienced by the WCLK signal should be equal to that experienced by the DQ signal, as the flight time from the memory controller to the DRAM should be equal for both DQ and WCLK. The line of the respective read clock signal RCLK_M1, RCLK_M2 from the corresponding module is coupled directly to the received WCLK signal line. In this manner, the read clock signal RCLK is generated by returning the write clock signal WCLK received at each module 42A, 42B and is therefore synchronized therewith. Therefore, upon the memory controller 40 initiating a read activity from a memory module 42, the read data DQ is received by the memory controller 40 in synchronization with the read clock RCLK of the corresponding module. As explained above, it is preferable that each module 42A, 42B have an associated read clock signal RCLK_M1, RCLK_M2 that is independent of the other modules signals. In addition, the read clock signal paths RCLK_M1, RCLK_M2 are crossed at location 53 on the motherboard hosting the system bus 50 to ensure a similar pin configuration for all modules. As described above, additional dummy load capacitors 54A, 54B are tied to the read clock signals that are not utilized by a given module in order to provide for equalization with the loading of the data bus DQ.

Figure 5:
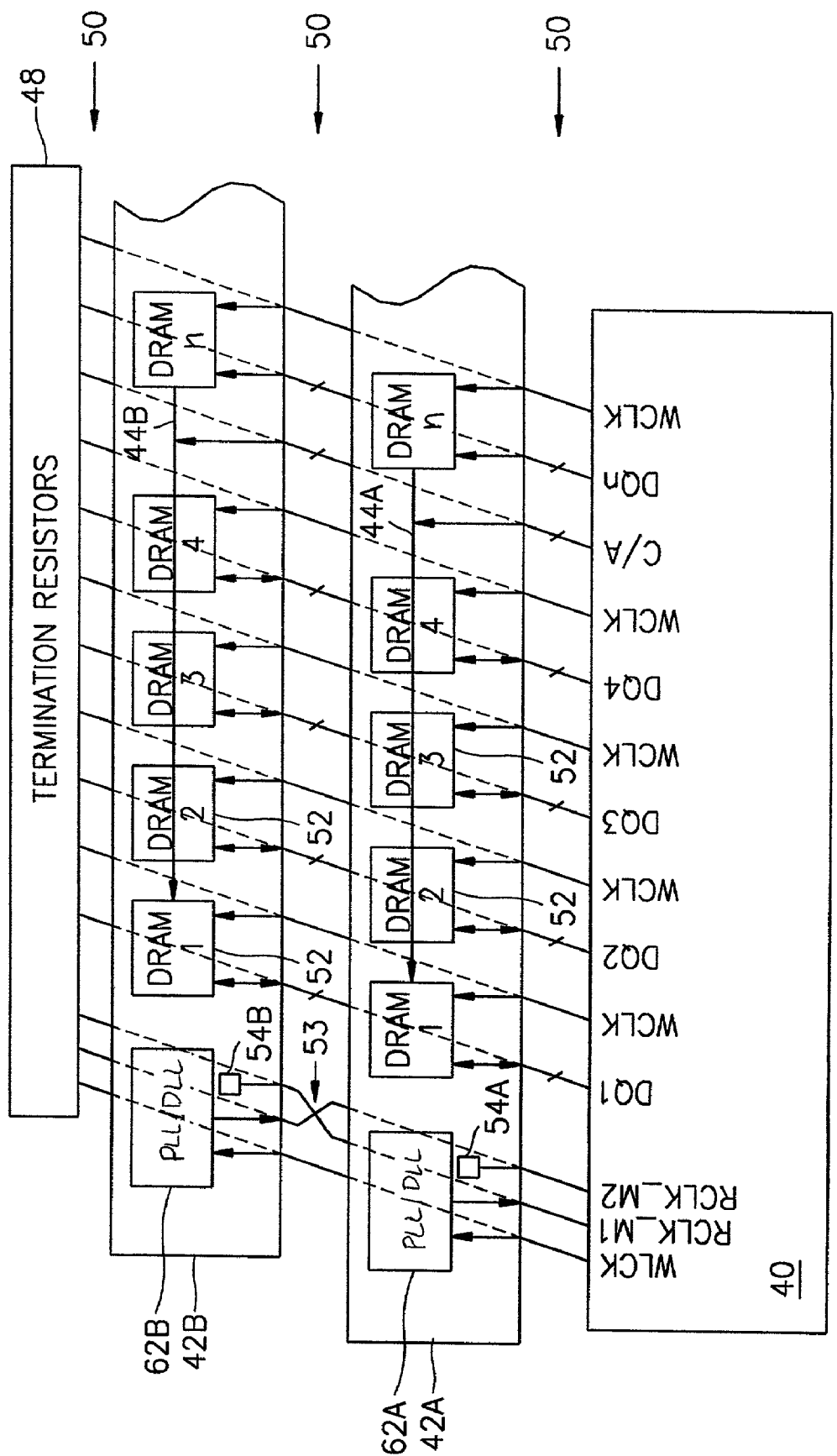
FIG. 5 is a schematic block diagram of a second alternative embodiment of the present invention wherein the memory modules include a phase locked loop (PLL) for generating the RCLK signal in synchronization with the WCLK signal.

FIG. 5 is a schematic block diagram of an alternative embodiment of the present invention applicable, for example, to memory modules 42A, 42B that do not include a C/A buffer 46. In this configuration, the C/A signal bus is distributed from the memory controller 40 via the system bus 50 to the memory devices 52 on the memory modules 42A, 42B via signal paths 44A, 44B. A phase locked loop (PLL) 62A, 62B, or alternatively a delay locked loop (DLL), is provided on each module 42A, 42B for receiving the write clock WCLK signal and for generating a respective read clock RCLK signal for the module 42A, 42B. Phase locked loops and delay locked loops are well-known mechanisms for ensuring that an output signal is generated so that the transition edges of the output signal are aligned to that of an input signal. The operation of the phase locked loop of FIG. 5 is the same as that of the phase locked loop included in the C/A buffer of 46 of FIG. 3. As described above, dummy load capacitors or dummy pins 54A, 54B can be provided for read clock signals RCLK not associated with a given module to provide for equalization with the loading of the data bus DQ.

Figure 6:
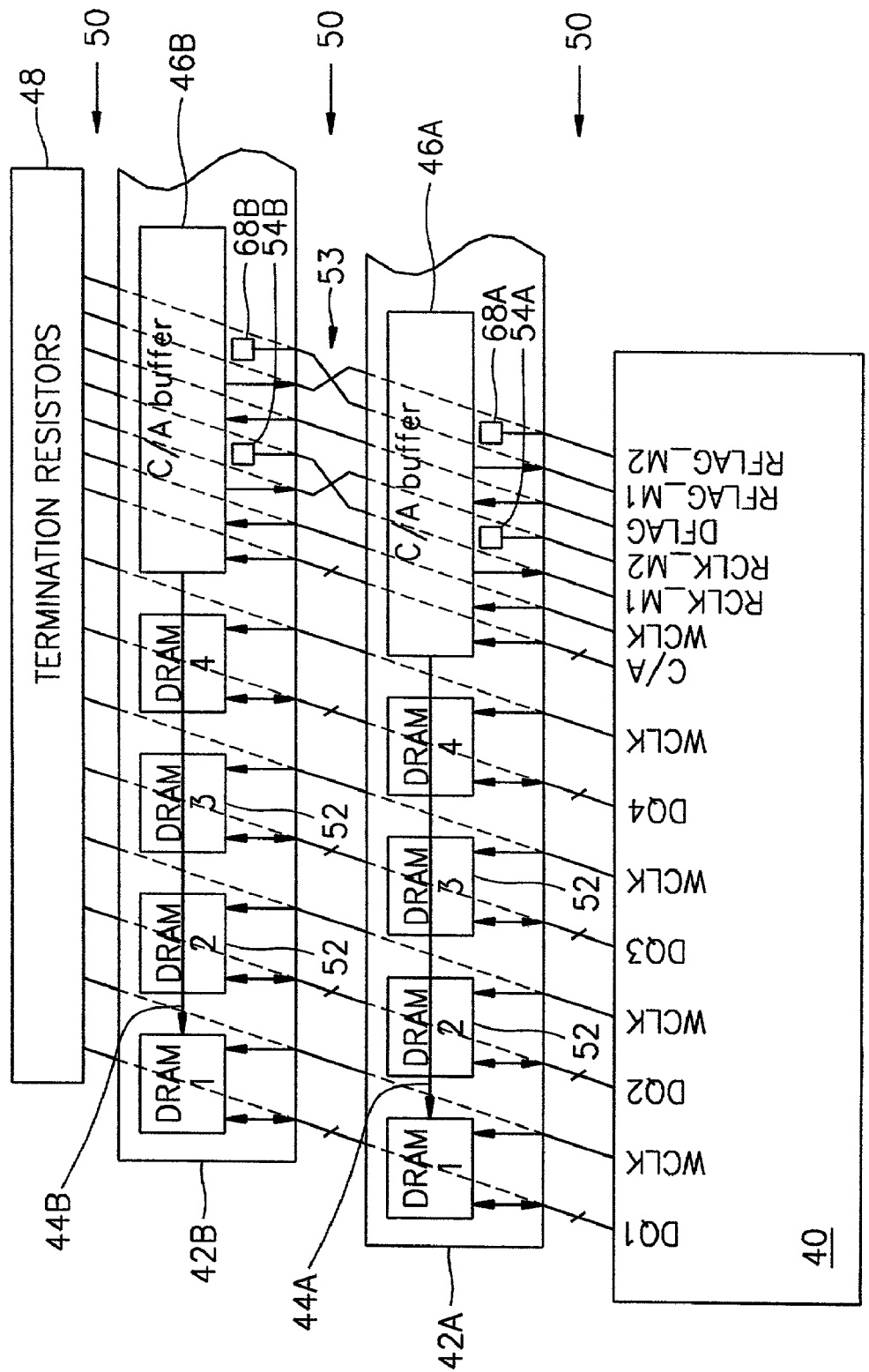
FIG. 6 is a schematic block diagram of a third alternative embodiment of the present invention wherein the memory modules further generate an RFLAG signal in synchronization with a received DFLAG signal.

In traditional memory systems, it is common for the data bus DQ to operate at a rate that is two times faster than the command/address C/A bus. For this reason, commands are provided to the memory modules in advance of the data so that the memory devices on the module have sufficient time to prepare for the data read or write operation. The latency between the command and data signals is commonly referred to as column address strobe (CAS) latency. With reference to FIG. 6, a DFLAG signal, generated by the memory controller 40, provides the CAS latency information for both read and write operations to the modules 42A, 42B. As shown in FIG. 6, the C/A buffer 46A, 46B receives the DFLAG signal from the memory controller 40 and outputs the DFLAG signal to each memory device 52 on the module 42A, 42B via the buffered C/A signal 44A, 44B. Upon sensing a transition in the DFLAG signal, each memory device 52 outputs read or write data on the data bus DQ following a predetermined time interval. The DFLAG signal is received in synchronization with the write clock WCLK signal and the data bus signals DQ by virtue of the DFLAG signal being configured in the same stub bus structure. For this reason, the DFLAG signal will experience the same propagation delay as the WCLK and data bus DQ signals in the direction of propagation between the memory controller 40 and the memory modules 42A, 42B.

The C/A buffer 46 may optionally generate a flag signal for the return path RFLAG in synchronization with the received DFLAG signal in the same manner that the read clock RCLK signal is generated in synchronization with the write clock WCLK signal. For example, a delay locked loop or phase locked loop may be employed within the C/A buffer 46 to generate the return flag signals RFLAG_M1, RFLAG_M2 based on the received DFLAG signal. The RFLAG signal carries timing information related to when read data DQ output from the memory devices 52 will arrive at the memory controller 40. While the memory controller 40 can receive valid data transferred from the memory devices 52 on the modules 42A, 42B in synchronization with the read clock signal RCLK_M1, RCLK_M2 transferred from the memory module, it is possible for the memory controller to receive invalid data from the memory devices 52 should the time difference between the WCLK and RCLK signals at the controller be greater than one clock cycle. The RFLAG signal ensures that valid data is received by the memory controller 40 at all times, and as such, the memory controller 40 receives the data in response to the read flag signal RFLAG_M1, RFLAG_M2 and read clock signal RCLK_M1, RCLK_M2 transferred from the module 42A, 42B. In the same manner, the memory devices 52 on the module 42A, 42B receive the data in response to the DFLAG and WCLK signals transferred form the controller 42A, 42B.

Accordingly, the memory controller 40 recognizes the read data DQ arrival time via the RFLAG signal output by the C/A buffer 46A. The RFLAG signal has the same propagation delay time as the read data DQ signals because the RFLAG signal is configured to have the same bus stub structure as the DQ signal. Assuming that the memory controller 40 is able to compensate for a difference in phase between the DFLAG signal generated at the controller 40 and a read data DQ transmitted by the memory modules 42, then there is no need for the separate RFLAG signal. Assuming such a need, the RFLAG signal can be generated, and routed in the same manner as the RCLK signals. Preferably, the RFLAG and DFLAG signals are routed with the control/address (C/A) bus signals, instead of with the data bus DQ signals, since, if the RFLAG and DFLAG signals were to be routed with the data bus DQ signals, then multiple RFLAG and DFLAG signals would be needed—at least one for each memory device 52. However, if the RFLAG and DFLAG signals are routed on the C/A bus, only one of each RFLAG and DFLAG is needed. It is further preferable that each C/A buffer 46 of each memory module 42A, 42B generate and transmit an independent RFLAG signal RFLAG_M1, RFLAG_M2 to the memory controller 40 since respective path lengths from the modules 42A, 42B generating the independent RFLAG signals to the memory controller 40 are different. Loading equalization can be achieved by including dummy capacitors or dummy pins 68A, 68B as described above. Similar pin out configurations can be achieved for the different modules by crossing signal paths, for example at location 53 on the system bus 50, as explained above.

Figure 7:
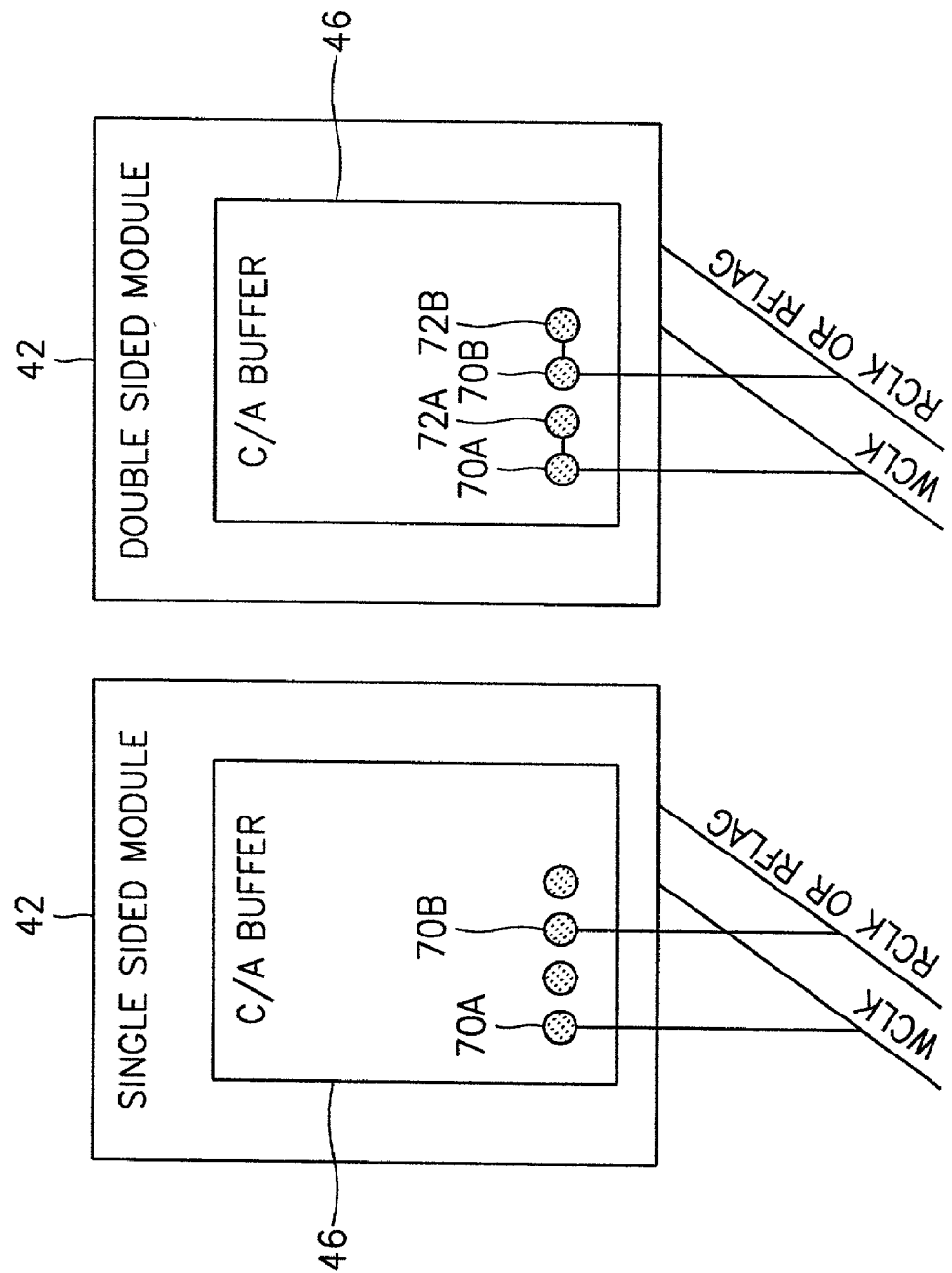
FIG. 7 illustrates a command/address (C/A) buffer including dummy pins in accordance with the present invention.
Figure 8:
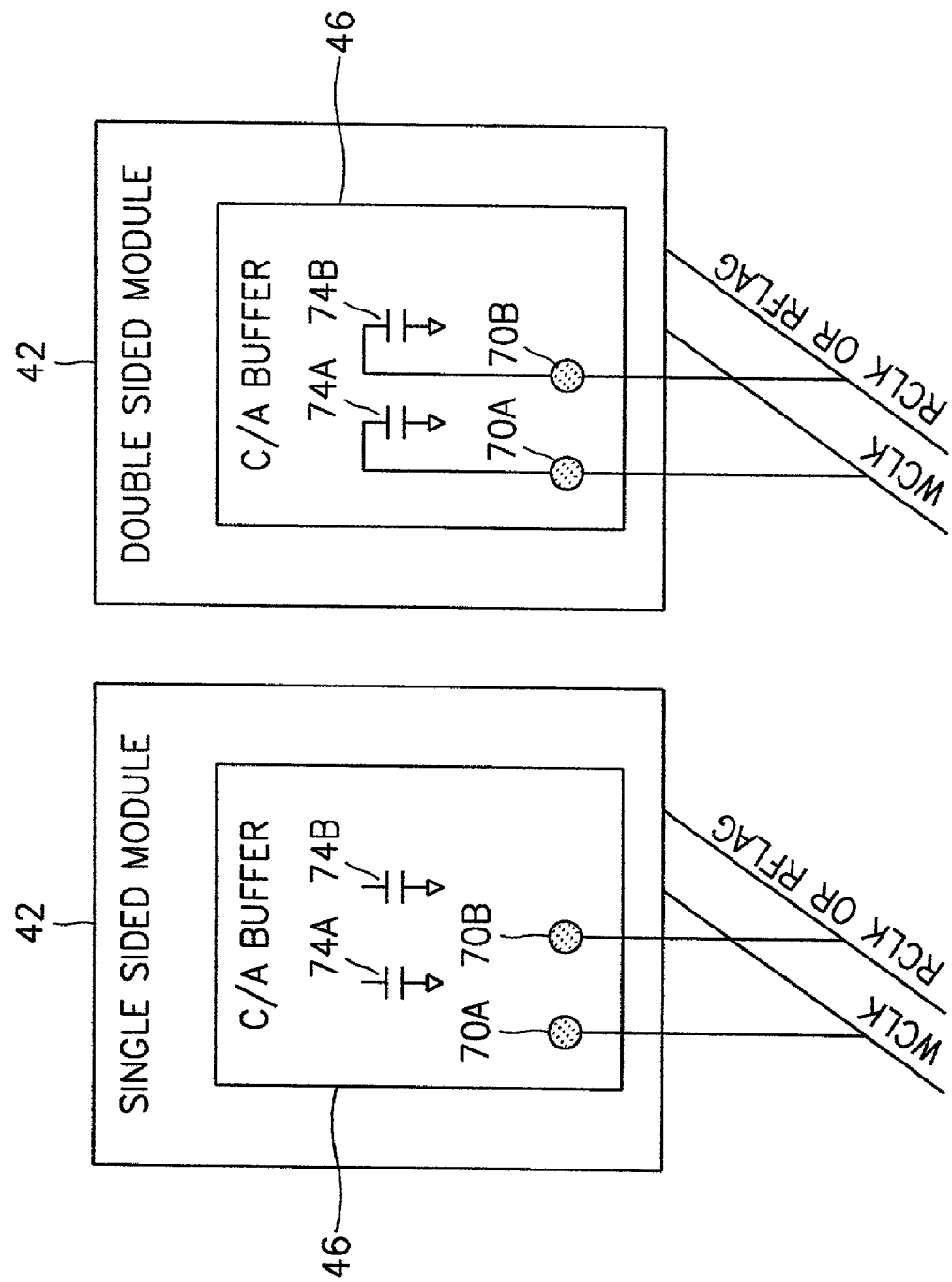
FIG. 8 illustrates a C/A buffer including dummy capacitors in accordance with the present invention.

Memory modules can be generally categorized as single-sided modules or double-sided modules; single-sided modules having memory devices on one face of the module, and double-sided modules having memory devices on both faces of the module. Loading of the data bus DQ and write clock line WCLK varies depending on the type of memory module. For example, loading of the WCLK signal is greater in a double-sided module as compared to that of a single-sided module, since the WCLK line is routed to two WCLK pins on the double-sided module one for the front-side DRAM, and the other for the rear-side DRAM, while on a single-sided module only one connection is needed. In contrast, loading of the write clock WCLK input to the C/A buffer, and loading of the read clock signal RCLK_M1, RCLK_M2 output from the C/A/ buffer are the same for the single-sided module and double-sided module, since the C/A buffer is typically mounted on only one side of the module. Depending on the type of module (single-sided/double-sided), a skew caused by the difference in loading of the DQ bus, WCLK line, and RCLK_M1, RCLK_M2 may occur. To address this issue, dummy pins 72A, 72B can be provided to the C/A buffer as shown in FIG. 7. For the double-sided module, a second set of dummy contacts 72A, 72B are provided and connected to the WCLK/RCLK/RFLAG pins 70A, 70B as shown. Alternatively, switchable capacitors 74A, 74B may be provided in a C/A buffer as shown in FIG. 8, for the double-sided module, the capacitance value of the dummy capacitors 74A, 74B being set to match the extra capacitance experienced by the DQ and WCLK lines at the second side of the module. In the case of the double-sided module, the DQ and WCLK lines connected to the DRAMs see two input pins, one at the front side and the other at the back side of the module, while the WCLK, RCLK, and RFLAG lines connected to the C/A buffer see only one input pin, since the C/A buffer is typically mounted on only a single side of the module. Therefore, a loading mismatch exists between the DQ/WCLK lines connected to the DRAM devices on both sides of the module and the WCLK/RCLK/RFLAG lines connected to the C/A buffer on one side of the module. To alleviate this loading mismatch, the C/A buffer 46 of the present invention provides dummy pins 72A for the WCLK, RCLK and RFLAG lines, or alternatively, a dummy capacitor 74A, 74B for those lines.

Figure 9:
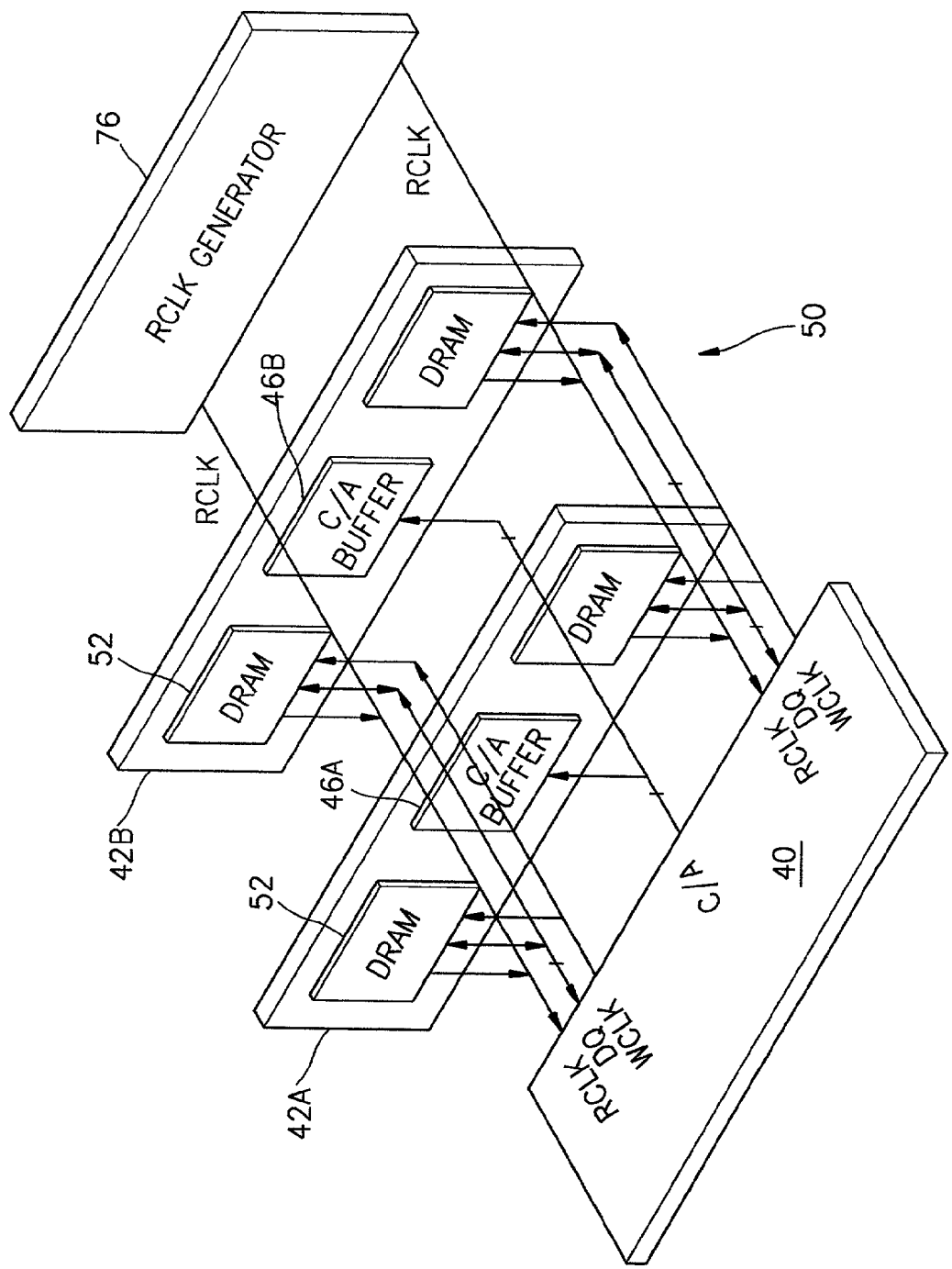
FIG. 9 is a schematic block diagram of a memory system in accordance with the present invention wherein the RCLK signal is generated remotely and propagates along the system bus in a direction opposite that of the write clock WCLK signal.
Figure 10:
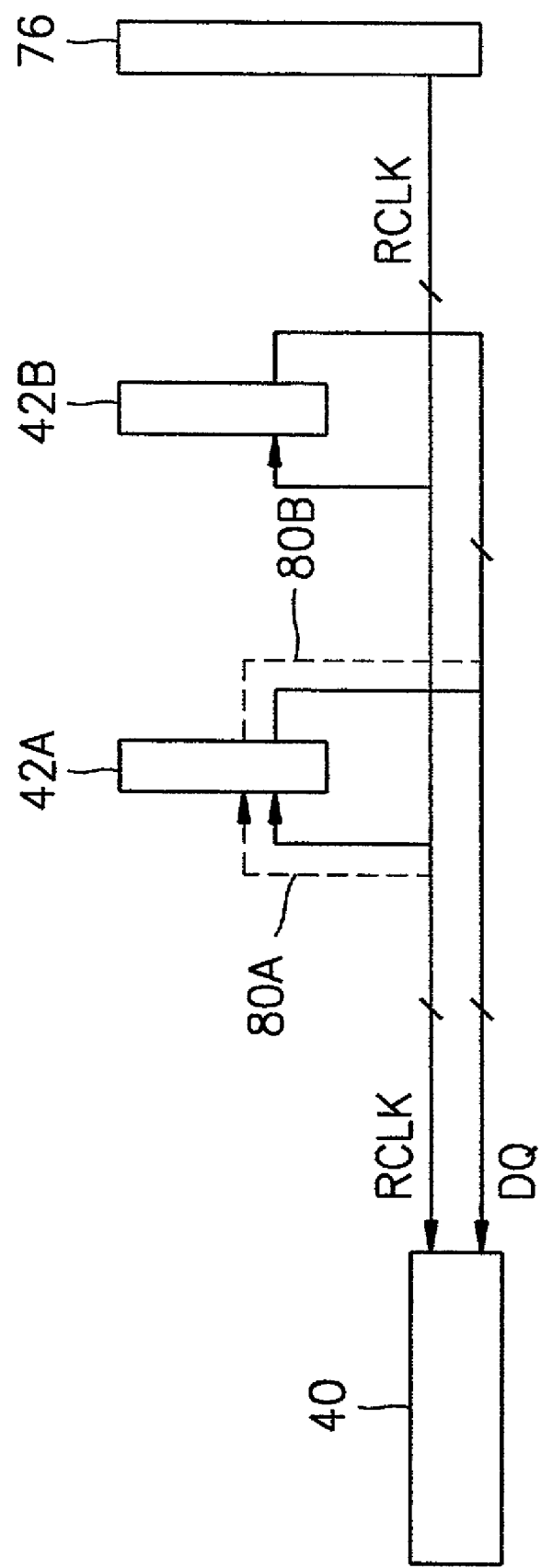
FIG. 10 illustrates phase delay generated between the RCLK and read data DQ during a read operation in the embodiment of FIG. 9 due to the stub configuration, in accordance with the present invention.

With reference to FIG. 9, an alternative embodiment of the present invention is provided. In this embodiment, instead of generating the read clock RCLK based on, and in synchronization with, the received write clock WCLK, a separate read clock generator 76 is provided for generating a read clock signal RCLK that is distributed across the system bus 50 in a direction opposite the direction of propagation of the write clock WCLK. The read clock line RCLK is terminated at the memory controller 40. In this embodiment, the inherent problem of the stub bus architecture is apparent. With reference to FIG. 10, assume that the RCLK signal is generated at generator 76, and assume that data is to be read from a memory device located on module 42A. In this scenario, the RCLK signal is generated and propagates along the RCLK line directly to the memory controller 40. Memory module 42A receives the RCLK signal from the RCLK line following a time delay represented by the propagation of the RCLK signal along the path of dashed line 80A. The data to be read DQ are then released onto the DQ bus via the path represented by dashed line 80B. The read data DQ then continue to propagate toward the memory controller 40A. In this manner, the RCLK signal will be available at the controller 40 prior to the read data DQ. In view of this, a phase difference exists between the RCLK signal and the DQ data, the phase difference being represented by the propagation delay along the stub signal lines represented by dashed lines 80A and 80B. Assuming this time skew to be small, or assuming that the controller can compensate for the time skew, the configuration of FIG. 9 may be applied to the memory system of the present invention.

In this manner, according to the above embodiment of FIGS. 3-8, a single free-running clock is provided through the same path as data signals in a memory system having a stub bus configuration. A single clock domain is employed for both read and write operations. For both operations, the read or write clock signal is routed through the same transmission path as the data, thereby increasing system transfer rates by maximizing the window of data validity. In this manner, data bus utilization is increased due to the elimination of a need for a preamble interval for the strobe signal, and pin count on the memory module connectors is reduced.

While this invention has been particularly shown and described with references to preferred embodiments thereof, it will be understood by those skilled in the art that various changes in form and details may be made herein without departing from the spirit and scope of the invention as defined by the appended claims.

We claim:

1. A memory system having a stub configuration comprising:
    a controller for generating a first clock signal, a control signal, an address signal and data signals on a data bus, the data bus, first clock signal, control signal, and address signal being arranged on a system bus in a stub configuration;
    a memory module including memory devices coupled to the controller via the system bus;
    a second clock signal generator independent of both the controller and the memory module for generating a second clock signal independently from the first clock signal that is sourced at a location that is beyond an outermost memory module on the system bus relative to the controller, the memory module receiving the first clock signal, the second clock signal and the control signal that includes a read or write command;
    the first clock signal propagating from the controller to the memory module in a first direction of propagation, and the second clock signal propagating from the memory module to the controller in a second direction of propagation;
    the memory module, in response to the write command, initiating a write operation for writing the data signals from the data bus to the memory devices in synchronization with the first clock signal; and
    the memory module, in response to the read command, initiating a read operation for reading data from the memory to the data bus in response to the second clock signal, the controller receiving the data signals on the data bus in response to the second clock signal during the read operation.

2. The memory system of claim 1 wherein the first clock signal comprises a write clock and wherein the second clock signal comprises a read clock.

3. The memory system of claim 2 wherein the memory controller further compensates for phase difference between the received second clock signal and the data signals on the data bus.

4. A method of transferring data in a memory system having a stub configuration comprising:
    generating a first clock signal, a control signal, an address signal and data signals on a data bus at a controller, the data bus, first clock signal, control signal, and address signal being arranged on a system bus in a stub configuration;
    generating a second clock signal independently from the first clock signal at a second clock signal generator independent of both the controller and a memory module including memory devices coupled to the controller via the system bus such that the second clock signal is sourced at a location that is beyond an outermost memory module on the system bus relative to the controller;
    receiving the first clock signal, the second clock signal and the control signal that includes a read or write command at the memory module;
    transmitting the first clock signal from the controller to the memory module in a first direction of propagation, and transmitting the second clock signal from the memory module to the controller in a second direction of propagation;
    the memory module, in response to the write command, initiating a write operation for writing the data signals from the data bus to the memory devices in synchronization with the first clock signal; and
    the memory module, in response to the read command, initiating a read operation for reading data from the memory to the data bus in response to the second clock signal, the controller receiving the data signals on the data bus in response to the second clock signal during the read operation.

5. A memory system having a stub configuration comprising:
    a controller for generating a first clock signal, a control signal, an address signal and data signals on a first clock signal line, a control signal line, an address signal line and a data bus, respectively; and
    a first memory module including plurality of memory devices, each directly connected to the data bus and the first clock signal line for receiving the data signals and the first clock signal respectively, and a single control/address buffer device that is connected to the control signal line, the address signal line and the first clock signal line for receiving the control signal, the address signal, and the first clock signal respectively and supplying the control signal and the address signal to each of the plurality of memory devices in response to the first clock signal;
    the first memory module, in response to a write command, initiating a write operation for writing the data signals from the data bus to the at least one memory device in synchronization with the first clock signal; and
    the first memory module, in response to a read command, initiating a read operation for reading data from the at least one memory device to the data bus, and the control/address buffer device generating a second clock signal in response to the first clock signal, the second clock signal being provided to the controller on a second clock signal line that is separate from the first clock signal line, the controller receiving the data signals on the data bus in response to the second clock signal during the read operation.

6. The memory system of claim 5 wherein the memory system further includes a second memory module, the first and second memory modules generating respective first and second independent return clock signals as the second clock signal, and further comprising a motherboard coupling the first and second memory modules and the controller, the motherboard including the data bus, the control signal line, the address signal line, the first clock signal line and first and second independent return clock signal lines for transfer of the first and second return clock signals from the first and second memory modules to the controller.

7. The memory system of claim 6 wherein the first and second return clock signal lines are crossed on the motherboard between the first and second memory modules.

8. The memory system of claim 6 wherein the first return clock signal line is coupled to a dummy load on the second memory module and wherein the second return clock signal line is coupled to a dummy load on the first memory module.

9. The memory system of claim 8 wherein the dummy load comprises a load capacitor or a dummy pin.

10. The memory system of claim 8 wherein the dummy load is selected to match the capacitance loading of the data bus.

11. The memory system of claim 5 wherein the control/address buffer further receives a first flag signal from the controller and provides a second flag signal to the controller during the read operation, the controller receiving the read data from the at least one memory device in response to the second clock signal and the second flag signal.

12. The memory system of claim 5 wherein the first clock signal comprises a write clock and wherein the second clock signal comprises a read clock.

13. The memory system of claim 5 wherein the system comprises multiple memory modules and wherein the multiple memory modules each generate independent second clock signals, the second clock signals each being different in phase relative to each other.

14. The memory system of claim 13 wherein the phases of the multiple second clock signals are different in phase due to the difference in propagation delay between each of the memory modules and the controller.

15. The memory system of claim 5 wherein the propagation delay of the second clock signal on the second clock signal line from the first memory module to the controller is substantially equal to that of the data signals on the data bus.

16. The memory system of claim 5 wherein the control/address buffer device further includes a phase locked loop that receives the first clock signal and generates the second clock signal in response to the first clock signal.

17. The memory system of claim 5 wherein the control/address buffer device further includes a delay locked loop that receives the first clock signal and generates the second clock signal in response to the first clock signal.

18. The memory system of claim 5 wherein the control/address buffer device includes a return path that is coupled to the first clock signal line that receives the first clock signal for generating the second clock signal in response to the first clock signal that is transmitted on the second clock signal line.

19. The memory system of claim 18 wherein the control/address buffer device further includes a capacitor having a capacitance that is selected to compensate for capacitive loading on the data bus by the at least one memory device of the memory module; the capacitor being coupled to a junction of the first clock signal line and the return path.

20. The memory system of claim 5 further comprising a first flag signal generated by the controller, the first memory module, in response to the first flag signal, controlling timing of initiation of the write operation or read operation, and if a read operation is commanded, generating a second flag signal in response to the first flag signal, the second flag signal being provided to the controller, the controller receiving the data signals on the data bus in response to the second clock signal and the second flag signal during a read operation.

21. The memory system of claim 20 wherein the memory system further includes a second memory module, the first and second memory modules generating respective first and second independent second flag signals, and further comprising a motherboard coupling the first and second memory modules and the controller, the motherboard including the data bus, a control bus for transfer of the control signal, an address bus for transfer of the address signal; a first flag signal line for transfer of the first flag signal, and first and second independent return flag signal lines for transfer of the first and second return flag signals, the first flag signal line and the first and second return flag signal lines being routed with the control bus and the address bus.

22. The memory system of claim 21 wherein the first and second return flag signal lines are crossed on the motherboard between the first and second modules.

23. The memory system of claim 21 wherein the first return flag signal line is coupled to a dummy load on the second memory module and wherein the second return flag signal line is coupled to a dummy load on the first memory module.

24. The memory system of claim 23 wherein the dummy load comprises a load capacitor or a dummy pin.

25. The memory system of claim 23 wherein the dummy load is selected to match the capacitance loading of the data bus.

26. The memory system of claim 5 wherein the control/address buffer device is mounted to a first side of the first memory module, and further comprising a dummy load for coupling to a first signal line of the control/address buffer device to provide load matching with a load experienced by a second signal line of the memory devices mounted to both first and second sides of the memory module.

27. The memory system of claim 26 wherein the dummy load comprises a load capacitor or a dummy pin.

28. The memory system of claim 26 wherein the first signal line comprises the first clock signal line or the second clock signal line, and wherein the second signal line comprises the data bus or the first clock signal line.

29. The memory system of claim 5 wherein, during the read operation, the data signals and the second clock signal are output from the first memory module in synchronization with the first clock signal.

30. A memory system having a stub configuration, comprising:
a controller for generating a first clock signal, a control signal, an address signal and data signals on a first clock signal line, a control signal line, an address signal line and a data bus, respectively; and
a first memory module including a plurality of memory devices, each directly connected to the data bus and the first clock signal line for receiving the data signals and the first clock signal respectively, and a clock return that is coupled to the first clock signal line that receives the first clock signal, and a single control/address buffer device receiving the control signal, the address signal, and the first clock signal respectively, and supplying the control signal and the address signal to each of the plurality of memory devices in response to the first clock signal;
the first memory module, in response to a write command, initiating a write operation for writing the data signals from the data bus to the at least one memory device in synchronization with the first clock signal; and
the first memory module, in response to a read command, initiating a read operation for reading data from the at least one memory device to the data bus, and the clock return providing a second clock signal in response to the first clock signal, the second clock signal being provided to the controller on a second clock signal line that is separate from the first clock signal line, the controller receiving the data signals on the data bus in response to the second clock signal during the read operation.

31. The memory system of claim 30 wherein the first memory module further includes a capacitor having a capacitance that is selected to compensate for capacitive loading on the data bus by the at least one memory device of the memory module; the capacitor being coupled to a junction of the first clock signal line and the clock return.

32. The memory system of claim 30 wherein the first memory module further includes a control/address buffer device that is connected to the control signal line, the address signal line and the first clock signal line for receiving the control signal, the address signal, and the first clock signal.

33. The memory system of claim 30 wherein the clock return comprises a phase locked loop coupled to the first clock signal line that receives the first clock signal and generates the second clock signal on the second clock signal line in response to the first clock signal.

34. The memory system of claim 30 wherein the clock return comprises a delay locked loop coupled to the first clock signal line that receives the first clock signal and generates the second clock signal on the second clock signal line in response to the first clock signal.

35. The memory system of claim 30 wherein the memory system further includes a second memory module, the first and second memory modules generating respective first and second independent return clock signals as the second clock signal, and further comprising a motherboard coupling the first and second memory modules and the controller, the motherboard including the data bus, the control signal line, the address signal line, the first clock signal line and first and second independent return clock signal lines for transfer of the first and second return clock signals from the first and second memory modules to the controller.

36. The memory system of claim 35 wherein the first and second return clock signal lines are crossed on the motherboard between the first and second memory modules.

37. The memory system of claim 35 wherein the first return clock signal line is coupled to a dummy load on the second memory module and wherein the second return clock signal line is coupled to a dummy load on the first memory module.

38. The memory system of claim 37 wherein the dummy load comprises a load capacitor or a dummy pin.

39. The memory system of claim 37 wherein the dummy load is selected to match the capacitance loading of the data bus.

40. The memory system of claim 30 wherein the first clock signal comprises a write clock and wherein the second clock signal comprises a read clock.

41. The memory system of claim 30 wherein the system comprises multiple memory modules and wherein the multiple memory modules each generate independent second clock signals, the second clock signals each being different in phase relative to each other.

42. The memory system of claim 41 wherein the phases of the multiple second clock signals are different in phase due to the difference in propagation delay between each of the memory modules and the controller.

43. The memory system of claim 30 wherein the propagation delay of the second clock signal on the second clock signal line from the first memory module to the controller is substantially equal to that of the data signals on the data bus.

44. The memory system of claim 30 wherein, during the read operation, the data signals and the second clock signal are output from the first memory module in synchronization with the first clock signal.

45. A method of transferring data in a memory system having a stub configuration comprising:
generating a first clock signal, a control signal, an address signal and data signals at a controller on a first clock signal line, a control signal line, an address signal line and a data bus, respectively; and
receiving the data signals and the first clock signal at a first memory module including a plurality of memory device, each directly connected to the data bus and the first clock signal line respectively, and receiving the control signal, the address signal, and the first clock signal and supplying the control signal and the address signal to each of the plurality of memory devices in response to the first clock signal at a single control/address buffer device that is connected to the control signal line, the address signal line and the first clock signal line respectively,
the first memory module, in response to a write command, initiating a write operation for writing the data signals from the data bus to the at least one memory device in synchronization with the first clock signal; and
the first memory module, in response to a read command, initiating a read operation for reading data from the at least one memory device to the data bus, and the control/address buffer device generating a second clock signal in response to the first clock signal, the second clock signal being provided to the controller on a second clock signal line that is separate from the first clock signal line, the controller receiving the data signals on the data bus in response to the second clock signal during the read operation.

46. The method of claim 45 wherein the memory system further includes a second memory module, the first and second memory modules generating respective first and second independent return clock signals as the second clock signal, and further comprising a motherboard coupling the first and second memory modules and the controller, the motherboard including the data bus, the control signal line, the address signal line, the first clock signal line and first and second independent return clock signal lines for transfer of the first and second return clock signals from the first and second memory modules to the controller.

47. The method of claim 46 wherein the first and second return clock signal lines are crossed on the motherboard between the first and second memory modules.

48. The method of claim 46 wherein the first and second independent return clock signals are different in phase.

49. A method of transferring data in a memory system having a stub configuration comprising:
generating a first clock signal, a control signal, an address signal and data signals at a controller on a first clock signal line, a control signal line, an address signal line and a data bus, respectively; and
receiving the data signals and the first clock signal at a first memory module including at plurality of memory devices, each directly connected to the data bus and the first clock signal line respectively, and receiving the first clock signal at a clock return that is coupled to the first clock signal line and receiving the control signal, the address signal, and the first clock signal and supplying the control signal and the address signal to each of the plurality of memory devices in response to the first clock signal, at a single control/address buffer device,
the first memory module, in response to a write command, initiating a write operation for writing the data signals from the data bus to the at least one memory device in synchronization with the first clock signal; and
the first memory module, in response to a read command, initiating a read operation for reading data from the at least one memory device to the data bus, and the clock return providing a second clock signal in response to the first clock signal, the second clock signal being provided to the controller on a second clock signal line that is separate from the first clock signal line, the controller receiving the data signals on the data bus in response to the second clock signal during the read operation.

50. The method of claim 49 wherein the first memory module further includes a capacitor having a capacitance that is selected to compensate for capacitive loading on the data bus by the at least one memory device of the memory module; the capacitor being coupled to a junction of the first clock signal line and the clock return.

51. The method of claim 49 wherein the first memory module further includes a control/address buffer device that is connected to the control signal line, the address signal line and the first clock signal line for receiving the control signal, the address signal, and the first clock signal.

52. The method of claim 49 wherein the clock return comprises a phase locked loop coupled to the first clock signal line that receives the first clock signal and generates the second clock signal on the second clock signal line in response to the first clock signal.

53. The method of claim 49 wherein the clock return comprises a delay locked loop coupled to the first clock signal line that receives the first clock signal and generates the second clock signal on the second clock signal line in response to the first clock signal.

* * * * *

UNITED STATES PATENT AND TRADEMARK OFFICE
CERTIFICATE OF CORRECTION

PATENT NO. : 7,313,715 B2  Page 1 of 1
APPLICATION NO. : 10/043047
DATED : December 25, 2007
INVENTOR(S) : Chang-sik Yoo, Byung-se So and Kye-hyun Kyung It is certified that error appears in the above-identified patent and that said Letters Patent is hereby corrected as shown below:

Column 16, line 48 delete "at" and insert --a--

Signed and Sealed this

Twelfth Day of August, 2008

JON W. DUDAS
*Director of the United States Patent and Trademark Office*

UNITED STATES PATENT AND TRADEMARK OFFICE
CERTIFICATE OF CORRECTION

PATENT NO. : 7,313,715 B2
APPLICATION NO. : 10/043047
DATED : December 25, 2007
INVENTOR(S) : Chang-sik Yoo, Byung-se So and Kye-hyun Kyung It is certified that error appears in the above-identified patent and that said Letters Patent is hereby corrected as shown below:

Column 16, line 48 delete "at" and insert --a--

Signed and Sealed this

Twenty-sixth Day of August, 2008

JON W. DUDAS
*Director of the United States Patent and Trademark Office*